United States Patent [19]
Peltz et al.

[11] 3,864,728

[45] Feb. 4, 1975

[54] SEMICONDUCTOR COMPONENTS HAVING BIMETALLIC LEAD CONNECTED THERETO

[75] Inventors: Hanns-Heinz Peltz; Hubert Pretsch; Detlev Schmitter, all of Munich, Germany

[73] Assignee: Siemens Aktiengesellschaft, Munich, Germany

[22] Filed: Aug. 27, 1973

[21] Appl. No.: 391,599

Related U.S. Application Data

[63] Continuation of Ser. No. 199,135, Nov. 16, 1971, abandoned.

[30] Foreign Application Priority Data

Nov. 20, 1970 Germany........................... 2057126

[52] U.S. Cl......................... 357/71, 357/68, 357/69, 357/80, 29/576

[51] Int. Cl............................. H01l 3/00, H01l 5/00

[58] Field of Search.......... 317/234, 1, 5.2, 5.3, 5.4; 29/576, 626, 627

[56] References Cited

UNITED STATES PATENTS

| | | | |
|---|---|---|---|
| 3,487,541 | 1/1970 | Boswell | 29/626 |
| 3,588,628 | 6/1971 | Peck | 317/234 N |
| 3,680,198 | 8/1972 | Wood | 317/234 M |
| 3,729,820 | 5/1973 | Ihochi et al. | 317/234 L |
| 3,773,628 | 11/1973 | Misawa et al. | 317/234 N |

*Primary Examiner*—Andrew J. James
*Attorney, Agent, or Firm*—Herbert L. Lerner

[57] ABSTRACT

An arrangement for the bonding of semiconductor components. Semiconductor components or an integrated circuit are connected to a carrier via metallic ribbons, which are bent with respect to their longitudinal direction, the invention assuring improved bonding of the contacts and greater reliability of the finished components.

5 Claims, 5 Drawing Figures

SEMICONDUCTOR COMPONENTS HAVING BIMETALLIC LEAD CONNECTED THERETO

This is a continuation, of application Ser. No. 199,135, filed Nov. 16, 1971, now abandoned.

The present invention relates to an arrangement for the bonding of semiconductor components, particularly an integrated circuit, to a carrier, wherein the semiconductor components are provided with a semiconductor body with contact pads.

As is known, semiconductor systems are cemented or alloyed to a system carrier. The electrical connections between the contact pads of the semiconductor body and the carrier are made through bonding by wires. In particular small arrangements, represented particularly by the integrated circuits, such wire connections can be made only with great difficulty.

It also has been proposed already that at least two contact pads of the semiconductor body are connected, via the partially metallized surface of an intermediate substrate of electrically insulating plastic material, to a carrier in an electrically conducting manner.

Compared to the known arrangements, this arrangement offers improved bonding of the contacts and reliability of the finished components. It further makes possible a reduction of manufacturing costs, as they can be readily manufactured by automatic means.

Starting from this advantageous arrangement, the present invention has as an object to remove possible mechanical and thermal stresses between the semiconductor body and its external connections.

This problem is solved by the provision that at least two contact pads of the semiconductor body are each connected with the carrier in an electrically conducting manner by a metallic ribbon which is bent with respect to its longitudinal direction.

The metallic ribbons bent with respect to their longitudinal direction constitute an elastic member between the semiconductor body and its external connections or the carrier, respectively. Therefore, no stresses can occur between the semiconductor body and the carrier which would lead to the destruction or a reduction in quality of the finished components. Rather, a mechanically reliable encapsulation of the semiconductor component is assured.

In addition to an improved bonding of the contacts, the arrangement according to the invention, therefore, offers high reliability and carrying capacity of the finished component. The yield in assembly is increased and the manufacturing costs are thereby simultaneously reduced.

A further embodiment of the invention consists of the provision that the metallic ribbon consists of a copper film 5 to 20 $\mu$, and preferably 9 $\mu$ thick and a tin film arranged thereon 4 to 8 $\mu$, and preferably 6 $\mu$ thick.

These thicknesses assure, on the one hand, a reliable connection between the semiconductor body and the carrier and, on the other hand, the smallest possible design of the entire arrangement, which is of advantage particularly in wire-bonding integrated circuits.

A further embodiment of the invention consists of a method for manufacturing the device.

Thus, the semiconductor body is positioned by means of a heated suction head over a substrate, coated with at least one metallic film and consisting, preferably, of a polyimide foil, and is then applied to the latter. The contact pads of the semiconductor body are soldered to the metallic film by heating the suction head. After bonding the semiconductor bodies provided to the substrate, the latter is separated into individual intermediate substrates, each semiconductor body being soldered to at least one intermediate substrate. The ends of the intermediate substrate facing away from the semiconductor body are bent. These ends are soldered to the carrier via the metallic film. Finally, the intermediate substrate is separated from the metallic film in such a manner that the desired electrical and mechanical connections between the contact pads and the carrier is made via the metallic film which now has the form of at least two metallic ribbons.

The separation of the intermediate substrate from the metallic film makes possible a particularly intensive encapsulation of the component and thereby an increase of the mechanical strength of the plastic enclosure surrounding the component.

Finally, the invention provides an advantageous manner for the purpose of bending the ends facing away from the semiconductor body of the intermediate substrate. The semiconductor body with the intermediate substrate is lowered on a support table with prominence of 100 to 400 $\mu$, preferably 300 $\mu$, the base area of which corresponds approximately to the base area of the semiconductor body and is held on the prominence by a first plunger in such a manner that the intermediate substrate is situated between the semiconductor body and the prominence and in such a manner that the semiconductor body is pressed onto the prominence. Through a second plunger, coaxial with the first plunger, and the carrier the ends of the intermediate substrate, projecting over the prominence, are bent toward the support table and are soldered to the carrier.

Further characteristics and details of the invention may be seen from the following description of an Example of an embodiment, with reference to the Drawing, in which.

Figure 1:
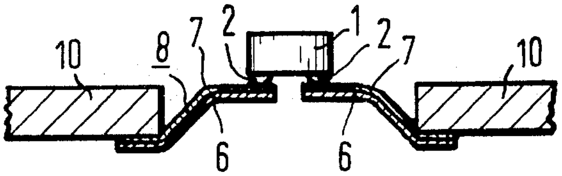
FIG. 1 shows a cross section through the arrangement according to the invention.

In FIG. 1, a semiconductor body with projecting contact pads 2 is seen. The contact pads 2 are each connected via a metallic ribbon 8 with metallic carrier 10 serving as the external connection. The metallic ribbons 8 consist of a copper film 6 which is 6 $\mu$ thick. The tin film 7 is here soft-soldered to the contact pads 2 and the carrier 10. In order to decrease mechanical and thermal stresses, the metallic ribbons 8 are bent with respect to their longitudinal direction. Each of the metallic ribbons 8 has a first plane portion and a second plane portion substantially parallel to the first plane portion with the second plane portion being soldered to the contact pad 2. As shown in FIG. 1, the intermediate portion of the metallic ribbon 8 forms an angle with the first plane portion and with the second plane portion.

The method for the manufacture of the arrangement according to the invention will now be described with reference to FIGS. 2 and 3. The same reference symbols are used for corresponding parts as in FIG. 1.

Figure 2:
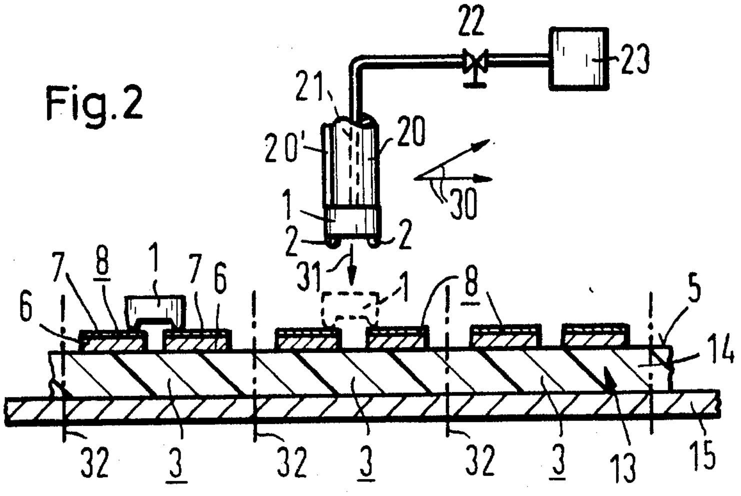
FIGS. 2 and 3 show, in cross section, steps in the method for manufacture of the arrangement of the invention.

In FIG. 2, a substrate plate 13 is first placed on an operating table 15. The substrate plate 13 consists of a polyimide foil 14 coated with copper and tin films 6, 7. A semiconductor body 1 is taken up by a suction head 20 and positioned in the position shown in the FIG. 2. For this purpose, the suction head 20 is movable in the plane parallel to the surface 5. This has been indicated in FIG. 2 by the arrows 30. The suction head 20 has a canal 21, which is shown by dashed lined. This canal 21 is connected with vacuum pump 23 via valve 22. The suction head 20 is, furthermore, provided with a heating device 20 which can be pulse heated. After positioning the semiconductor body 1, the suction head 20 is lowered so that the contact pads 2 of the semiconductor body 1 make contact with the tin films 7 arranged underneath them. This process step is indicated in FIG. 2 by the arrow 31 and the dashed position of the semiconductor body 1.

The suction head 20 is heated for a brief time by the heating device 20′ so that the contact pads 2 of the semiconductor body 1 are soft-soldered to the tin films 7. The valve 22 is then closed and the suction head 20 removed.

After all semiconductor bodies 1 are connected with the individual film of the coated substrate plate 13, which has a size of approximately 200 $cm^2$ to accommodate 800 semiconductor bodies, the substrate plate 13 is cut by means of an impact cutter or a suitable punch along the dot-dash line 32 into individual intermediate substrates 3.

For the sake of clarity, the copper and tin films 6, 7 which form the metallic ribbons 8 are shown foreshortened in their longitudinal direction.

Figure 3:
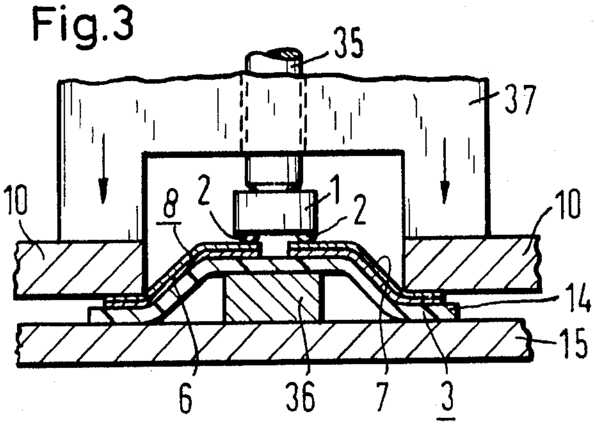

As is shown in FIG. 3, the intermediate substrates 3 are then soldered to the carriers 10 and simultaneously bent. To this end, the semiconductor body 1 is pressed via a first plunger 35 onto a block 36, about 300 $\mu$ high. The intermediate substrate 3 is thus provided between the semiconductor body 1 and the block 36. A second plunger 37, which is coaxial with respect to the first plunger 35, is then lowered so that the free ends of the intermediate substrate 3 are pushed downward as shown in FIG. 3. There, the carriers 10 are provided between the second plunger 37 and the intermediate substrate 3. The carriers 10 can, however, also be disposed directly underneath the intermediate substrate 3, that is upon the work table 15. At the same time, the tin films 7 are soft-soldered to the carriers 10.

The semiconductor body 1 and the carriers connected with it via the intermediate substrate 3 are boiled, for instance, in distilled water. The polyimide foil 14, which is approximately 22 $\mu$ thick, is thus separated so that now the semiconductor body 1 is connected with the carriers 10 only via the tin and copper films 6, 7 constituting the metallic ribbons 8. Then the arrangement is dried by means of a nitrogen stream. Finally, the semiconductor body 1 is installed with the carriers 10 connected to it on a multichip substrate or is built into a case. In connection herewith, two Examples are given in FIGS. 4 and 5, where again the same reference symbols have been chosen as in FIGS. 1 to 3 for corresponding parts.

Figure 4:
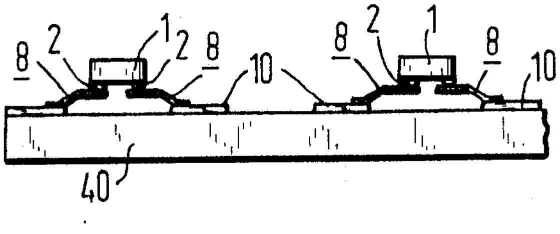
FIG. 4 shows, in cross section, the arrangement of the invention, on a substrate.

In FIG. 4, as an example for the manufacture of a semiconductor circuit, are provided on a multichip plate 40, two semiconductor bodies 1 via the metallic ribbons 8 and the carrier 10.

Figure 5:
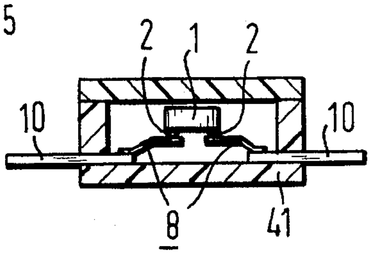
FIG. 5 shows, in cross section, the arrangement according to the invention in a housing.

Finally, in FIG. 5 a semiconductor body 1 is connected via the ribbons 8 to the carriers 10 which at the same time serve as leads and is built into a plastic housing 41.

What is claimed is:

1. In a system comprising a semiconductor body having a pair of contact pads projecting therefrom, a pair of carriers and a pair of electrically conductive connecting means, each connecting means electrically connecting a respective one of the contact pads to a respective one of the carriers, the improvement in which each of the connecting means is in the form of a bimetallic ribbon one face and 5 to 20 $\mu$ of the thickness of which is constituted of copper and the other face and 4 to 8 $\mu$ of the thickness of which is constituted of tin, the extremities of the contact pads and one of the faces of each of the carriers lie in respective spaced parallel planes, each of the ribbons having one end portion a face of which is coincident with the plane of the extremities of the contact pads and which is in contact with the extremity of a respective one of the contact pads, an opposite end portion a face of which is coincident with the plane of said faces of the carriers and which is in contact with said face of a respective one of the carriers and an intermediate portion connecting said end portions and lying in a plane oblique to said parallel planes.

2. In a system according to claim 1, the improvement in which the contact pads are more closely spaced than the carriers and are symmetrically positioned between the carriers.

3. In a system according to claim 2, the improvement in which the tin face of each ribbon contacts the respective contact pad and the respective carrier.

4. In a system according to claim 3, the improvement in which each ribbon is soldered to the respective contact pad and the respective carrier.

5. In a system according to claim 4, the improvement in which the copper film is 9 $\mu$ thick and the tin film is 6 $\mu$ thick.

* * * * *